United States Patent
Doyle et al.

(10) Patent No.: US 9,872,399 B1
(45) Date of Patent: Jan. 16, 2018

(54) IMPLEMENTING BACKDRILLING ELIMINATION UTILIZING ANTI-ELECTROPLATE COATING

(71) Applicant: International Business Machines Corporation, Armonk, NY (US)

(72) Inventors: Matthew S. Doyle, Chatfield, MN (US); Joseph Kuczynski, North Port, FL (US); Phillip V. Mann, Rochester, MN (US); Kevin M. O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/217,019

(22) Filed: Jul. 22, 2016

(51) Int. Cl.
| | |
|---|---|
| *H05K 1/00* | (2006.01) |
| *H05K 3/42* | (2006.01) |
| *H05K 1/11* | (2006.01) |
| *H05K 1/03* | (2006.01) |

(52) U.S. Cl.
CPC ............ *H05K 3/425* (2013.01); *H05K 1/034* (2013.01); *H05K 1/115* (2013.01); *H05K 3/423* (2013.01); *H05K 2201/015* (2013.01); *H05K 2203/143* (2013.01)

(58) Field of Classification Search
CPC . H05K 1/02; H05K 1/11; H05K 1/115; H05K 3/00; H05K 3/42; H05K 3/107; H05K 3/108; H05K 3/422; H05K 3/429; H01L 21/70; H01L 21/768; H01L 23/495
USPC .......... 174/258, 266; 430/170, 270.1, 280.1; 438/411, 637, 668
See application file for complete search history.

(56) References Cited

U.S. PATENT DOCUMENTS

| | | | | |
|---|---|---|---|---|
| 4,510,347 | A | | 4/1985 | Wiech, Jr. |
| 4,675,694 | A | * | 6/1987 | Bupara ............. B41J 2/33 346/140.1 |
| 5,798,559 | A | * | 8/1998 | Bothra ............. H01L 21/7682 257/508 |
| 6,147,249 | A | * | 11/2000 | Watanabe ......... C07C 69/753 526/281 |
| 6,280,898 | B1 | * | 8/2001 | Hasegawa ......... C07D 307/00 430/270.1 |
| 6,284,429 | B1 | * | 9/2001 | Kinsho ............. C07C 69/753 430/270.1 |

(Continued)

FOREIGN PATENT DOCUMENTS

| | | |
|---|---|---|
| CN | 10510706394 A1 | 11/2015 |
| CN | 105200473 A1 | 12/2015 |
| CN | 105338758 A1 | 2/2016 |

OTHER PUBLICATIONS

PTFE Deposition: View by MNX MEMS & Nanotechnology Exchange, https://www.mems-exchange.org/catalog/P3372/ 2016.

*Primary Examiner* — Xiaoliang Chen
(74) *Attorney, Agent, or Firm* — Joan Pennington

(57) ABSTRACT

A method and structure are provided for implementing enhanced via creation without creating a via barrel stub. The need to backdrill vias during printed circuit board (PCB) manufacturing is eliminated. After the vias have been drilled, but before plating, a plug is inserted into each via and the plug is lowered to a depth just below a desired signal trace layer. A thin anti-electroplate coating is applied onto the walls of the via below the signal trace. Then the plugs are removed and a standard board plating process for the PCB is performed.

5 Claims, 3 Drawing Sheets

(56) References Cited

U.S. PATENT DOCUMENTS

| | | | |
|---|---|---|---|
| 6,399,274 B1* | 6/2002 | Kinsho | G03F 7/039 430/270.1 |
| 6,420,085 B1* | 7/2002 | Nishi | G03F 7/0045 430/270.1 |
| 6,458,696 B1* | 10/2002 | Gross | H01L 21/2885 205/131 |
| 6,511,783 B1* | 1/2003 | Uenishi | G03F 7/0045 430/270.1 |
| 6,524,765 B1* | 2/2003 | Nishi | G03F 7/0045 430/270.1 |
| 6,667,145 B1* | 12/2003 | Nishi | G03F 7/039 430/270.1 |
| 6,673,512 B1* | 1/2004 | Uenishi | G03F 7/0045 430/270.1 |
| 6,887,646 B1* | 5/2005 | Fujiwara | G03F 7/0045 430/270.1 |
| 7,586,047 B2 | 9/2009 | Hayashi et al. | |
| 2001/0055726 A1* | 12/2001 | Kanna | G03F 7/0045 430/270.1 |
| 2002/0136980 A1* | 9/2002 | Sasaki | G03F 7/0045 430/270.1 |
| 2003/0049913 A1* | 3/2003 | Gaku | H05K 3/025 438/411 |
| 2003/0054287 A1* | 3/2003 | Yasunami | G03F 7/0045 430/270.1 |
| 2003/0075708 A1* | 4/2003 | Kodama | G03F 7/0045 252/582 |
| 2003/0165776 A1* | 9/2003 | Yasunami | G03F 7/0382 430/280.1 |
| 2003/0186537 A1* | 10/2003 | Yamanaka | H01L 21/76808 438/637 |
| 2003/0198894 A1* | 10/2003 | Mizutani | G03F 7/0045 430/280.1 |
| 2003/0203305 A1* | 10/2003 | Yasunami | G03F 7/0382 430/170 |
| 2004/0033438 A1* | 2/2004 | Hamada | G03F 7/0392 430/270.1 |
| 2005/0014092 A1* | 1/2005 | Hasegawa | C07D 307/00 430/270.1 |
| 2005/0038261 A1* | 2/2005 | Maesawa | C07D 487/04 548/461 |
| 2005/0117251 A1* | 6/2005 | Matono | G11B 5/3116 360/125.12 |
| 2006/0003252 A1* | 1/2006 | Hirayama | C08G 77/04 430/170 |
| 2008/0029855 A1* | 2/2008 | Chang | H01L 21/4828 257/666 |
| 2008/0241745 A1* | 10/2008 | Shirakawa | G03F 7/0382 430/281.1 |
| 2010/0044095 A1* | 2/2010 | Kuczynski | H05K 1/115 174/266 |
| 2010/0044096 A1* | 2/2010 | Kuczynski | H05K 1/115 174/266 |
| 2010/0126009 A1* | 5/2010 | Li | H05K 3/107 29/852 |
| 2012/0160556 A1 | 6/2012 | Kim et al. | |
| 2012/0181251 A1* | 7/2012 | Minegishi | G03F 7/11 216/49 |
| 2013/0277097 A1 | 10/2013 | Maeng | |
| 2013/0341073 A1 | 12/2013 | Hsu et al. | |
| 2014/0014401 A1 | 1/2014 | Liao et al. | |
| 2014/0220783 A1* | 8/2014 | Koumura | H01L 21/3081 438/703 |
| 2016/0278208 A1* | 9/2016 | Pen | H05K 1/115 |
| 2016/0372276 A1* | 12/2016 | Han | H01H 11/04 |

\* cited by examiner

IMPLEMENTING BACKDRILLING ELIMINATION UTILIZING ANTI-ELECTROPLATE COATING

FIELD OF THE INVENTION

The present invention relates generally to the data processing field, and more particularly, relates to a method and structure for implementing manufacture of a printed circuit board (PCB) with enhanced via creation without creating a via barrel stub, eliminating the need to back-drill.

DESCRIPTION OF THE RELATED ART

The computer hardware development industry has reached a point wherein many computer interfaces are of sufficient switching speed as to require signal routing layer change vias to be back-drilled to remove via barrel stubs. Backdrilling is a conventional technique used to remove the via barrel stub. Without removal of the unnecessary section or length of a via barrel, some amount of the propagating signal is reflected away from the intended receiver, thereby significantly reducing the amount of total energy effectively transferred from driver to receiver.

While there are known processes to mechanically remove these stubs, once back-drilled, it is no longer possible to probe those locations on the printed circuit board (PCB), cost of the PCB increases substantially, and success of the process is statistically less than ideal. These facts significantly complicate our ability to manufacture cost-effective PCBs, measure high-speed interfaces in the lab during system bring-up and model-to-hardware correlation activities, and maximize the electrical performance of our computer interfaces. When system errors occur in the field, the field engineer cannot measure and confirm function at these PCB via locations while at the customer's site.

A need exists for a method and structure for implementing via creation that eliminates creation of a via barrel stub, eliminating the need to back-drill, reducing PCB cost, and maximizing interface margin.

As used in the following description and claims, the term printed circuit board (PCB) should be understood to broadly include a printed wiring board or other substrate, an interconnect substrate, and various substrates including a plurality of insulator layers, and internal conductive traces.

SUMMARY OF THE INVENTION

Principal aspects of the present invention are to provide a method and structure for implementing manufacture of a printed circuit board (PCB) with enhanced via creation without creating a via barrel stub, eliminating the need to back-drill. Other important aspects of the present invention are to provide such method and structure substantially without negative effects and that overcome many of the disadvantages of prior art arrangements.

In brief, a method and structure are provided for implementing enhanced via creation without creating a via barrel stub. The need to backdrill during printed circuit board (PCB) manufacturing is eliminated. After the vias have been drilled, but before plating, a plug is inserted into each via and the plug is lowered to a depth just below a desired signal trace layer. A thin anti-electroplate coating is applied onto the walls of the via below the signal trace. Then the plugs are removed and a board plating process for the PCB is performed.

In accordance with features of the invention, the anti-electroplate coating includes, for example, a Teflon coating or a polytetrafluoroethylene (PTFE) coating, Teflon is a trade name for PTFE.

In accordance with features of the invention, the Teflon coating is applied, for example, using vapor deposition onto the walls of the via below the signal trace.

In accordance with features of the invention, the coating prevents the plating from creating via barrel stubs, thus eliminating the need to backdrill each via after the plating process.

In accordance with features of the invention, eliminating back-drilling improves yield and late fail discoveries, both of which can improve cost and reliability of boards.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structure are provided for implementing enhanced via creation without creating a via barrel stub. The need to backdrill vias during printed circuit board (PCB) manufacturing is eliminated. After the vias have been drilled, but before plating, a plug is inserted into each via and the plug is lowered to a depth just below a desired signal trace layer. A thin anti-electroplate coating is applied onto the walls of the via below the plug and the signal trace. Then the plugs are removed and a board plating process for the PCB is performed.

Figure 1:
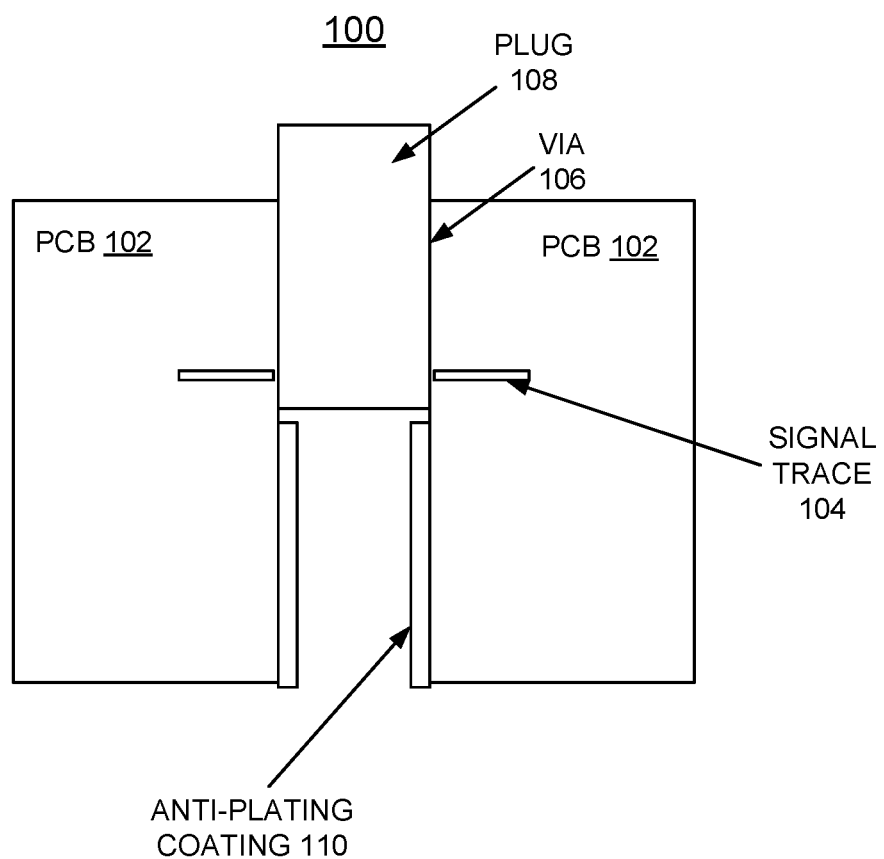
FIG. 1 illustrates an example structure for manufacturing a printed circuit board (PCB) with enhanced via creation without creating a via barrel stub, eliminating the need to back-drill in accordance with the preferred embodiment.

Having reference now to the drawings, in FIG. 1, there is shown an example structure generally designated by reference character 100 for manufacturing a printed circuit board (PCB) with enhanced via creation without creating a via barrel stub, eliminating the need to back-drill in accordance with the preferred embodiment.

Structure 100 includes a printed circuit board (PCB) 102 having an internal conductive or signal trace 104. PCB 102 includes an insulator substrate or insulator layers, with one or more internal conductive traces 104. Structure 100 includes a via 106 extending through the printed circuit board (PCB) 102 and the internal conductive trace 104. Structure 100 includes an anti-electroplate coating 110 covering the walls of the via 106 below the signal trace 104. The anti-electroplate coating 110 eliminates via barrel stub creation during a PCB plating process during PCB manufacturing. The anti-electroplate coating 110 is a chemically resistant polymer and is hydrophobic. The anti-electroplate coating 110 has a selected thickness, for example, in a range between 0.2 µm and 0.5 µm.

The anti-electroplate coating 110 includes, for example, a polytetrafluoroethylene (PTFE) coating (e.g., trade name Teflon), that is applied for example, using vapor deposition onto the walls of the via 106 below the signal trace 104.

"PTFE Deposition: View" by MNX MEMS & Nanotechnology Exchange, detailing example vapor deposition of Teflon, is provided at:
https://www.mems-exchange.org/catalog/P3372/

The PTFE coating 110 prevents the PCB plating process from creating via barrel stubs, thus eliminating the need to backdrill each via after the plating process. Eliminating back-drilling improves yield and late fail discoveries, both of which can improve cost and reliability of boards.

In accordance with features of the invention, the printed circuit board (PCB) 102 and via 106 are formed generally including standard PCB manufacturing processes, including via drilling and plating. However, the step of back-drilling at the end is removed and the PCB process of the invention provides that after the vias 106 have been drilled, but before plating, a small plug 108 is inserted into each via 106 extending to a defined depth just below the desired signal trace layer 104. A thin coating 110 of Teflon is then applied using vapor deposition onto the walls of the via 106 below the signal trace 104, and then the plugs 108 are removed. The PCB 102 is then sent through the normal plating process. The coating 110 prevents the plating from taking hold, thus eliminating the need to backdrill each via after the plating process.

Figure 2:
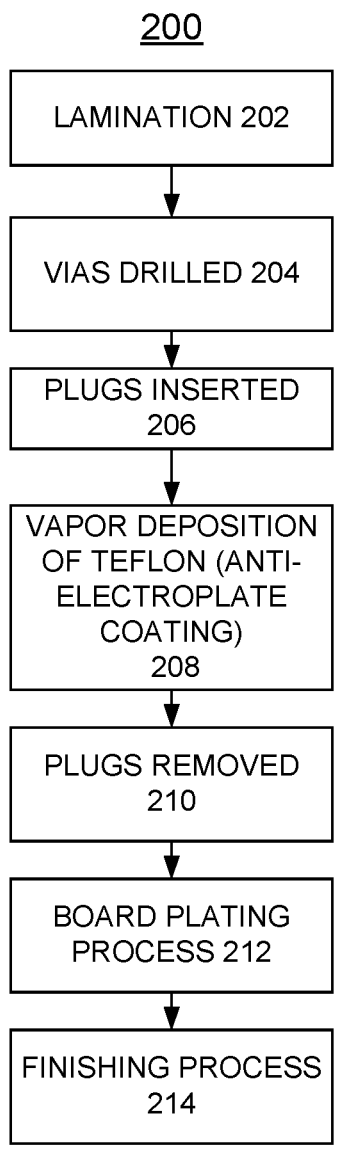
FIG. 2 is a flow chart illustrating example steps for implementing a structure embodying the enhanced via creation without creating a via barrel stub in accordance with the preferred embodiment.

Referring now to FIG. 2, there is shown a flow chart illustrating example steps generally designated by reference character 200 for implementing a structure embodying the enhanced via creation without creating a via barrel stub in accordance with the preferred embodiment starting at a block 202.

As indicated at a block 202, a lamination is formed defining the PCB 102 and at least one internal conductive traces 104.

As indicated at a block 204, vias 106 are drilled. Conventional via drilling is performed.

As indicated at a block 206, the plugs 108 are inserted into the via 106, with the plugs extending from a top or first surface to a depth below the signal trace 104. The plugs 108 optionally are configured as sprayers (like fuel injectors) to apply the Teflon coating applied to the walls of the via 106 below plugs 108. Optionally, individual plugs 108 having a specified length are pushed flush with one side of the PCB 102, then moved or poked out from the other PCB side. Optionally, individual plugs 108 are mechanically inserted to a specific depth, the retracted. Optionally, an array of plugs 108, typically of differing lengths extending from a plate are all inserted at once, the removed.

As indicated at a block 208, the anti-electroplate coating 110 is applied to the walls of the via 106 below plugs 108 and the signal trace 104, for example, by vapor deposition of Teflon.

As indicated at a block 210, the plugs 108 are removed from the vias 106 after the anti-electroplate coating 110 is applied.

As indicated at a block 212, the PCB plating process is performed, using a conventional plating process.

As indicated at a block 214, conventional PCB finishing processes are performed, advantageously eliminating the need to backdrill each via after the plating process.

Figure 3:
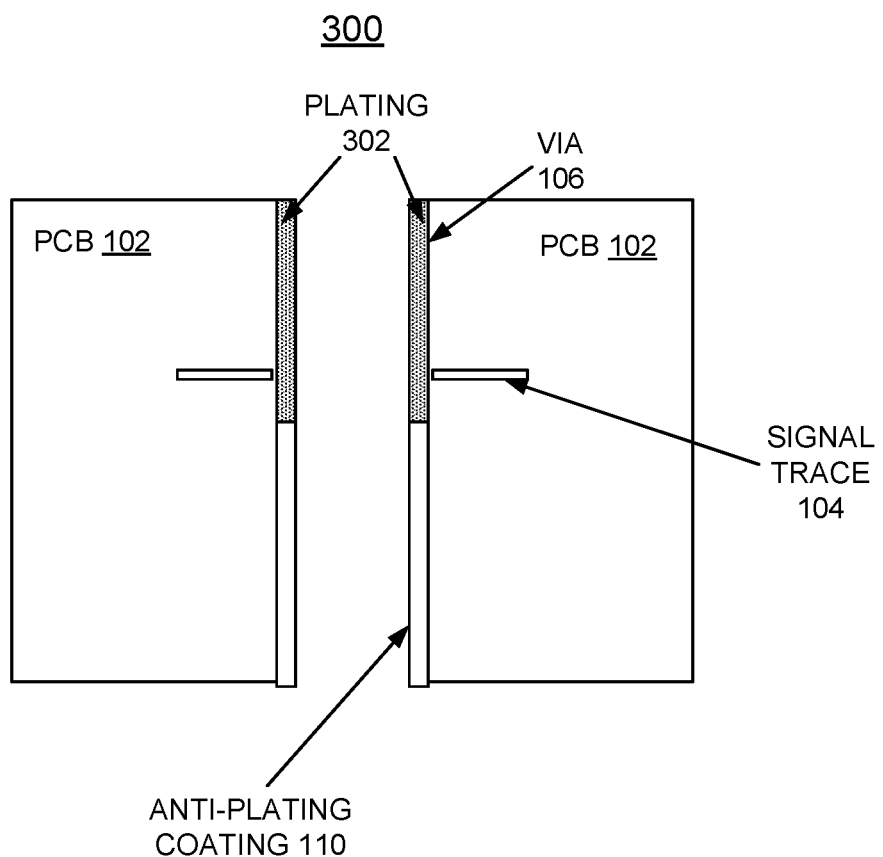
FIG. 3 illustrates an example structure for manufacturing a printed circuit board (PCB) with enhanced via creation without creating a via barrel stub, eliminating the need to back-drill in accordance with the preferred embodiment.

Referring now to FIG. 3, there is shown an example resulting structure generally designated by reference character 300 resulting from manufacturing a printed circuit board (PCB) with enhanced via creation without creating a via barrel stub, eliminating the need to back-drill in accordance with the preferred embodiment. Structure 300 shows the plugs 108 removed from the vias 106 after the anti-electroplate coating 110 is applied.

Structure 300 includes the printed circuit board (PCB) 102 having the internal conductive or signal trace 104. Structure 100 includes the via 106 extending through the printed circuit board (PCB) 102 and the internal conductive trace 104. Structure 300 includes the anti-electroplate coating 110 covering the walls of the via 106 below the signal trace 104. Structure 300 includes a plating 302 applied during the PCB plating process that is performed using a conventional plating process.

In accordance with features of the invention, the alternative method for via creation eliminates creation of the via barrel stub. Since the via barrel stub is not created, the need to back-drill is eliminated, reducing PCB cost and maximizing interface margin.

While the present invention has been described with reference to the details of the embodiments of the invention shown in the drawing, these details are not intended to limit the scope of the invention as claimed in the appended claims.

What is claimed is:

1. A structure for implementing enhanced via creation without creating a via barrel stub during printed circuit board (PCB) manufacturing comprising:
   a printed circuit board (PCB);
   said printed circuit board (PCB) having an internal conductive trace;
   a via extending through the printed circuit board (PCB) and the internal conductive trace; and
   an anti-electroplate coating covering the walls of the via below the signal trace; said anti-electroplate coating formed of a chemically resistant polymer having a selected thickness of approximately 0.2 µm, said anti-electroplate coating remaining on the via walls, preventing PCB plating from PCB plating process from taking hold on the covered via walls, said anti-electroplate coating eliminating via barrel stub creation during PCB manufacturing.

2. The structure as recited in claim 1 wherein said anti-electroplate coating is formed of a hydrophobic polymer.

3. The structure as recited in claim 1 wherein said anti-electroplate coating is formed of polytetrafluoroethylene (PTFE).

4. The structure as recited in claim 3 wherein said anti-electroplate coating is applied using vapor deposition onto the walls of the via below the signal trace.

5. The structure as recited in claim 1 wherein said anti-electroplate coating has a selected thickness less than 0.5 μm.

* * * * *